United States Patent
Petersen

(10) Patent No.: US 8,169,795 B2
(45) Date of Patent: May 1, 2012

(54) AUDIO POWER CONVERSION SYSTEM

(75) Inventor: Lars Petersen, Virum (DK)

(73) Assignee: Bang & Olufsen Icepower A/S, Lyngby (DK)

( * ) Notice: Subject to any disclaimer, the term of this patent is extended or adjusted under 35 U.S.C. 154(b) by 223 days.

(21) Appl. No.: 12/224,288

(22) PCT Filed: Feb. 23, 2007

(86) PCT No.: PCT/IB2007/000450
§ 371 (c)(1),
(2), (4) Date: Sep. 16, 2008

(87) PCT Pub. No.: WO2007/096761
PCT Pub. Date: Aug. 30, 2007

(65) Prior Publication Data
US 2009/0102295 A1    Apr. 23, 2009

(30) Foreign Application Priority Data
Feb. 24, 2006    (SE) ........................................ 0600410

(51) Int. Cl.
*H02M 3/335* (2006.01)
*H02M 7/217* (2006.01)

(52) U.S. Cl. .............. 363/17; 363/26; 363/89; 330/297; 323/222

(58) Field of Classification Search .............. 363/17, 363/22, 24, 63, 89, 126, 127, 26; 330/251, 330/297, 298; 323/222
See application file for complete search history.

(56) References Cited

U.S. PATENT DOCUMENTS

| | | | |
|---|---|---|---|
| 3,886,436 A * | 5/1975 | Wadlington | 323/225 |
| 5,117,198 A * | 5/1992 | Morenz | 330/251 |
| 6,169,681 B1 * | 1/2001 | Kemp et al. | 363/98 |
| 6,385,058 B1 * | 5/2002 | O'Meara | 363/21.01 |
| 7,362,180 B2 * | 4/2008 | Noro et al. | 330/298 |
| 2002/0097130 A1 * | 7/2002 | Vinciarelli et al. | 336/212 |
| 2003/0122615 A1 | 7/2003 | Zeff | |
| 2004/0145930 A1 * | 7/2004 | Noro | 363/127 |
| 2005/0017699 A1 * | 1/2005 | Stanley | 323/282 |
| 2007/0075689 A1 * | 4/2007 | Kinder et al. | 323/259 |
| 2007/0086224 A1 * | 4/2007 | Phadke et al. | 363/65 |

FOREIGN PATENT DOCUMENTS

WO    WO 2005/0191497    9/2005

OTHER PUBLICATIONS

Donald E. Pauly. "High Fidelity Switching Audio Amplifiers Using TMOS Power MOSFETs." Motorola Semiconductor Application Note, No. AN1042, 1989, pp. 1-12.

* cited by examiner

*Primary Examiner* — Adolf Berhane
*Assistant Examiner* — Fred E Finch, III
(74) *Attorney, Agent, or Firm* — Harness, Dickey & Pierce, P.L.C.

(57) ABSTRACT

An audio power conversion system includes a power supply having a positive supply rail and a negative supply rail for supplying power to a single ended class D amplifier. The system further includes a supply pump reduction circuit connected to the supply rails and adapted to redistribute a pumping charge from said power supply by forcing a current-flow from a rail with a higher voltage to a rail with a lower voltage. According to the at least one embodiment of the invention, the redistribution circuit is arranges to always distribute charge from the rail with the higher voltage. Thus, for practical circuits, the pump canceling occurs continuously and is not confined to every other cycle.

19 Claims, 8 Drawing Sheets

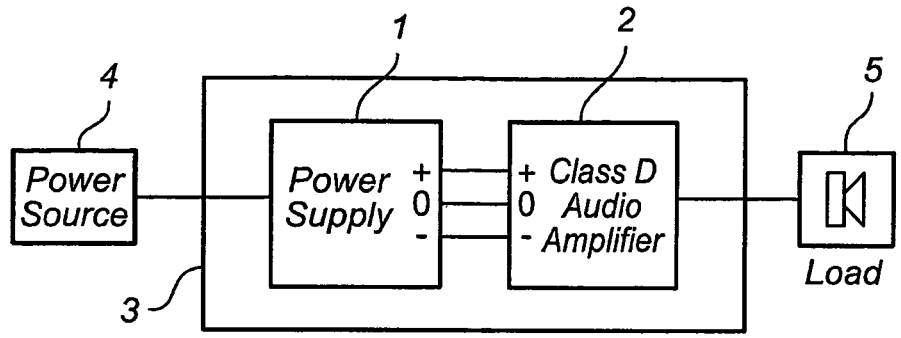
(Prior art) *Fig. 1*
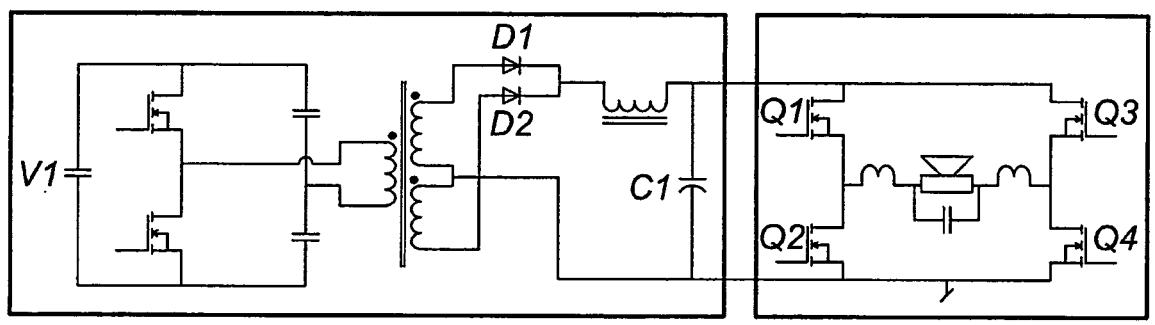
(Prior art) *Fig. 2*
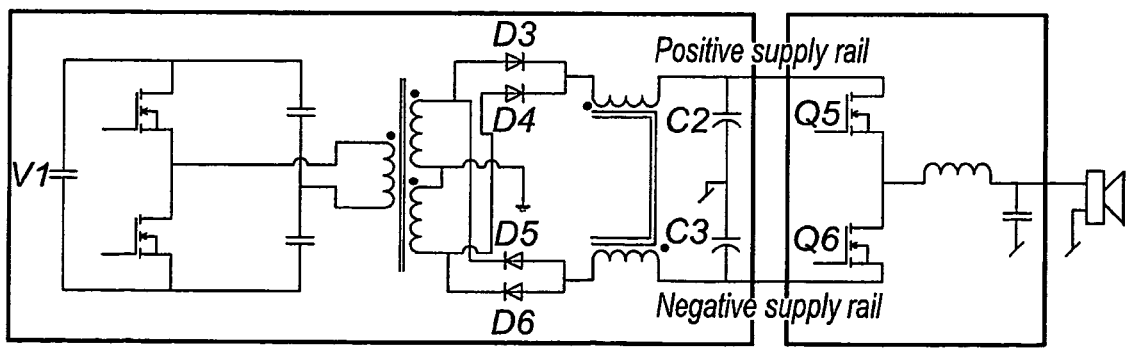
(Prior art) *Fig. 3*

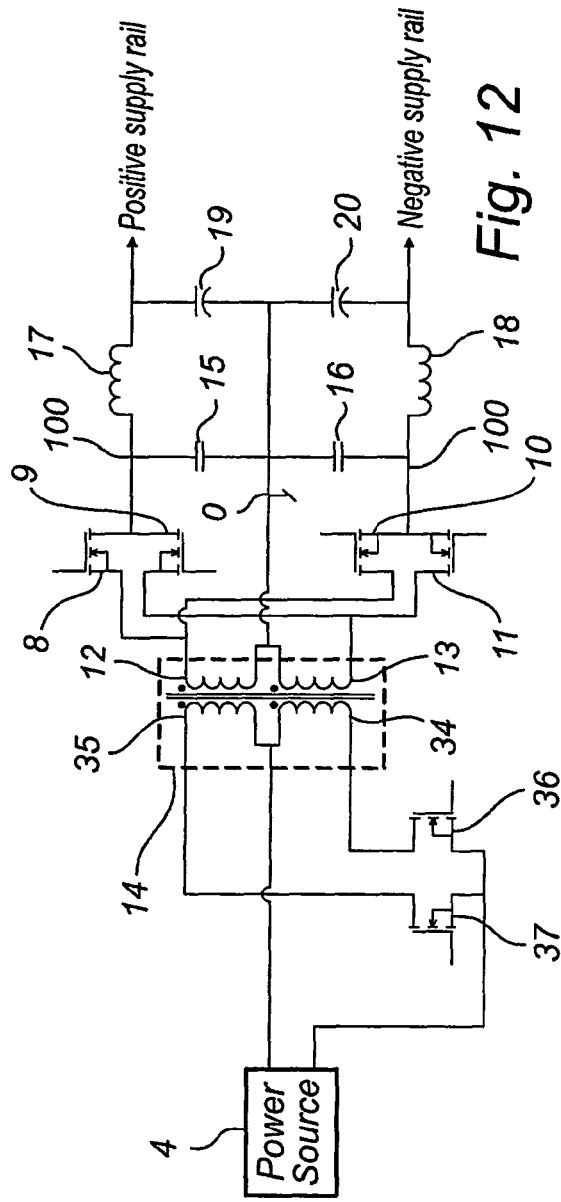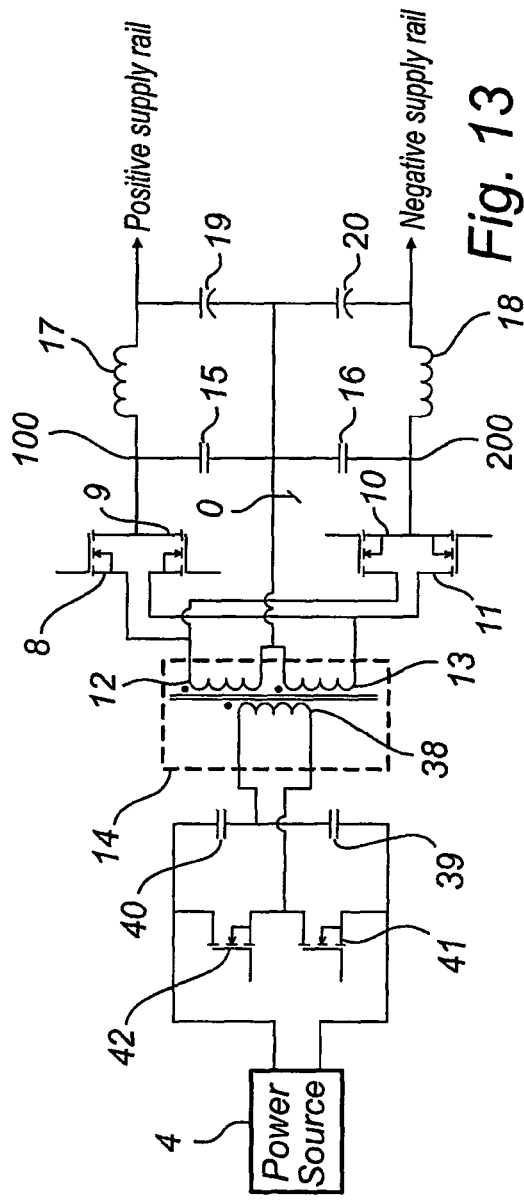

AUDIO POWER CONVERSION SYSTEM

TECHNICAL FIELD

This invention relates to AC-AC and DC-AC conversion for Audio where the inverter stage (DC-AC) is a Single-Ended class D stage (switching amplifier).

The AC-DC stage is preferable a Switch Mode Power Supply but the invention also relates to an Audio power conversion system using linear power supply techniques.

TECHNICAL BACKGROUND

The two predominant topologies used for class D amplifiers are the full-bridge- and the half-bridge topology. A prior art setup of these two topologies including power supply is shown in FIG. 2 and FIG. 3.

For low cost consumer products the half-bridge topology has a distinct advantage over the full-bridge since only half the number of power switches, drivers and output inductors is needed. Even though the voltage rating of the power switches is doubled in the half-bridge topology, there is still a manufacturing and cost benefit of the reduction. Since the speaker output terminals are referenced to ground, overload protection and output sensing becomes easier compared to the full-bridge topology.

The drawback of the half-bridge class D topology is the need for a dual rail supply and the fact that this topology will pump current back to the opposite supply rail from where the power is being drained. As shown in FIG. 4 the negative rail capacitor C2 will be charged by the output inductor current during the interval t∈[DT;T].

The charge delivered to back to the rail is dependent on load impedance, audio frequency, power level and rail voltage. These dependencies can be expressed as:

$$\Delta Q = \int_0^{Audio} \frac{V_{Peak} \cdot \sin(2 \cdot \pi \cdot f_{Audio} \cdot)}{2 \cdot R_{Load}} - \frac{(V_{Peak} \cdot \sin(2 \cdot \pi \cdot f_{Audio} \cdot t))^2}{2 \cdot R_{Load} \cdot V_{Rail}} \cdot dt \quad (1)$$

$$\Delta Q = \frac{2 \cdot V_{Audio} - \dfrac{\pi \cdot V_{Audio}^2}{2 \cdot V_{Rail}}}{4 \cdot \pi \cdot f_{Audio} \cdot R_{Load}} \quad (2)$$

The worst case pumping can be found by solving $dQ/dV_{Audio}=0$ for (2):

$$\frac{dQ}{dV_{Audio}} = \frac{2 \cdot V_{Rail} - \pi \cdot V_{Audio}}{2 \cdot \pi \cdot f \cdot V_{Rail}} = 0 \Leftrightarrow V_{Audio} = \frac{2}{\pi} \cdot V_{Rail} \quad (3)$$

The worst case charge can then be found by inserting (3) into (2):

$$\Delta Q_{Max} = \frac{V_{Rail}}{2 \cdot \pi^2 \cdot f_{Audio} \cdot R_{Load}} \quad (4)$$

Capacitor minimum size for a given rail voltage rise (a fraction of nominal rail voltage) can then be found as:

$$C_{Min} = \frac{1}{2 \cdot \pi^2 \cdot f_{Audio} \cdot \Delta V_{relative}} \quad (5)$$

FIG. 5 shows an example with a 20 Hz audio signal and an 4 ohm load impedance where the minimum rail capacitance is determined as a function of the allowable rail perturbation. If we allow for a 20% increase in rail voltage the minimum capacitance/channel/rail is approximately 3000 uF. For a stereo setup with a single-ended class D amplifier, the requirement win be 4 pcs 3300 uF capacitors to keep rail voltages within 20%. The resulting rail variation for the above example is shown in FIG. 5. The nominal rail voltage is 40 VDC and the perturbed rail is increased with approximately 8V (20%). The audio signal is equal to 2/π of the nominal rail voltage which is the worst case situation.

Also performance of the amplifier will be affected by the rail pumping especially non-feedback class D amplifiers where the asymmetrical rail perturbation will be modulated directly onto the audio signal dramatically increasing the distortion. Because of the dual supply with asymmetrical perturbation, any feed-forward system implemented will have little or no effect.

The benefits in terms of component count and complexity of using the single-ended class D amplifier compared to the full-bridge class D amplifier are quickly disappearing when taking into account the problems introduced by the rail pumping phenomena discussed above. These drawbacks can be summarized as:

Excessive use of rail capacitors=>higher cost and larger physical size

Higher voltage-rated devices in terms of rail Capacitors and amplifier MOSFETs=>higher cost and larger physical size Unacceptable audio performance for non-feedback class D amplifiers and degraded audio performance for feedback class D amplifiers=>reduced product value A voltage equalization scheme for a single-ended class D amplifier is suggested in WO 2005/091497. This circuit suffers from several disadvantages not encountered in the invention. Some of the disadvantages are:

1) The circuit redistributes the pumping energy in a 2 step operation. In the first step energy is stored in an inductor to be released in the second step.

2) The circuit uses two separate control systems.

3) The circuit will only limit the rail pumping—not cancel it.

4) The circuit will not help utilizing rail capacitance on both rails.

5) The circuit is based on a "buck-boost" topology renowned for its poor conversion efficiency.

If the rail pumping is to be effectively cancelled, a not insignificant amount of power has to be recycled between the rails. From (4) we can calculate the worst case average power that has to be converted from one rail to the other:

$$P_{Av\_Pumping} = \frac{V_{Rail}^2}{\pi^2 \cdot R_{Load}} \quad (6)$$

Introducing the maximum modulation index, MMax, as the fraction of maximum output voltage to rail voltage, the relation between average pumping power and maximum output power can be found as:

$$\frac{P_{Av\_Pumping}}{P_{Max\_Rload}} = \frac{2}{\pi^2 \cdot M_{Max}^2} \quad (7)$$

In a stereo setup of 2×125 W in 4 ohm with rail voltages of +/−40V and a maximum modulation index of 0.85, the average power to be redistributed in the worst case situation is approximately 81 W which accounts for 32% of the power delivered to the load!

To benefit from the advantages of using the single-ended class D amplifier the rail pumping problem needs to be addressed in an intelligent manner adding minimum complexity and cost to the audio power conversion system.

OBJECTS OF THE INVENTION

It is the objective of the invention to provide an audio power conversion system with:

1) Improved system performance, by eliminating or reducing the supply pumping thus improving supply quality leading to better audio performance.

2) Reduced complexity, since the invention enables all the benefits of the single-ended structure without introducing the classical problems that arises with the rail pumping phenomena.

Furthermore, in some embodiments the invention will also provide:

3) Improved system efficiency, by a combination of reducing the rail pumping thus reducing the peak-to-average power ratio of the power supply, and the single-ended structure of the class D amplifier (only 1 semiconductor in the power path).

4) Improved EMI performance, since the invention enables use of soft-switching techniques (ZVS, ZVC) which have a beneficial impact on the generated high frequency noise.

SUMMARY OF THE INVENTION

The objects of the invention are achieved by an audio power conversion system comprising a power supply having a positive supply rail and a negative supply rail for supplying power to a single ended class D amplifier. The system further comprises a supply pump reduction circuit connected to the supply rails, adapted to redistribute a pumping charge from said power supply by forcing a current-flow from a rail with a higher voltage to a rail with a lower voltage.

The core engine in the invention is the supply pump reduction circuit. The circuit works as a Supply Rail Mirror (SRM) which basically mirrors the voltage of the numerical smallest value to the other rail at any given time. In case of rail pumping, the SRM circuit will mirror the supply rails by redistributing the pumping charge in such a manner that supply rails will become essential equal numerically.

In the prior art, rail pumping is effected during two cycles, where the first cycle only can redistribute charge from the positive rail to the negative rail and the second cycle only can redistribute charge from the negative rail to the positive rail. For practical circuits this means that only the first or the second cycle is effective in redistributing the charge.

According to the current invention, the redistribution circuit is arranges to always distribute charge from the rail with the higher voltage. This means that for practical circuits the pump canceling occurs continuously and is not confined to every other cycle as for the prior art.

This also relates to how efficient the pump cancel circuits are: if the same amount of charge is to be redistributed by the invention and the prior art, the prior art will have to move twice the pumping charge in every cycle since only every second cycle is active. This corresponds to significant higher rms-currents in the prior art compared to the invention with loss of efficiency as a result.

Another advantages with the present invention is the simplicity of the circuit and the control. Because of the SRM topology and the self adjusting property of this approach, no control circuits are needed and any pumping resulting in rail voltage changes are corrected in an autonomous way.

The supply pump reduction circuit preferably comprises a high frequency transformer having a first and a second winding alternatingly connectable during a first and second cycle to said positive and negative supply rails, so as to cause a current to migrate from the rail with the highest voltage to the rail with the lowest voltage, while balancing said transformer. A transformer is a convenient way to realize a self adjusting redistribution circuit according to the present invention. The transformer windings will be connected differently during the two cycles so as to balance the transformer.

The supply pump reduction circuit can further comprise switching means for connecting, during said first cycle, said first winding between said positive supply rail and ground, and said second winding between said negative supply rail and ground, and, during said second cycle, said second winding between said positive supply rail and ground, and said first winding between said negative supply rail and ground.

Such switching will effectively mirror the two supply rails onto each other. This has two distinct advantages. Firstly, any variation in the two rail voltages is equalized (pump canceling). Secondly, this circuit effectively utilizes the capacity of both rails which means that dynamic power delivered from the rail capacitors becomes equal to that utilized in a single rail supply with the same amount of capacity.

The switching means can comprise controlled switches, such as MOSFETs. The simple drive pattern of the MOSFETs also enables a simple way to implement soft-switching techniques of the transistors. The circuit can then comprise a switch control system for providing two pulse trains with equally spaced, non-overlapping pulses of equal length, for controlling the controlled switches Further more, the circuit may include a separation filter that enables the SRM unit to be coupled to any dual rail supply while maintaining the soft-switching characteristics.

The switching means can also comprise uncontrolled switches like diodes, to reduce complexity. This version also enables soft-switching techniques.

The supply pump reduction circuit can be integrated in the main power supply for the single-ended class D amplifier. Such an integrated circuit will both supply the power to the amplifier while redistributing the pumping energy. The soft-switching characteristics can be maintained in this circuit by adapting the simple control scheme of the basic SRM converters.

BRIEF DESCRIPTION OF THE DRAWINGS

The preferred embodiment of the present invention will be further described in the following, with reference to the appended drawings.

FIG. 1 shows a prior art audio power conversion system using a single-ended class D amplifier FIG. 2 shows a prior art combination of a single rail power supply and a bridged class D amplifier FIG. 3 shows a prior art combination of a dual rail power supply and a single-ended class D amplifier.

FIG. 12-14 shows preferred embodiment of the invention as shown in FIG. 11.

DETAILED DESCRIPTION OF A PREFERRED EMBODIMENT

Figure 4:
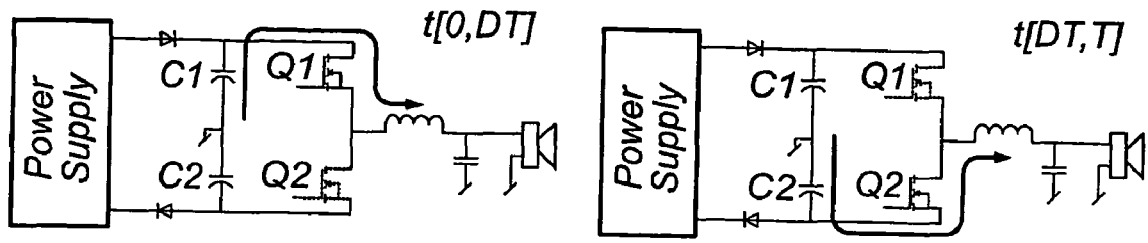
FIG. 4 shows the mechanism behind the supply pumping effect
Figure 5:
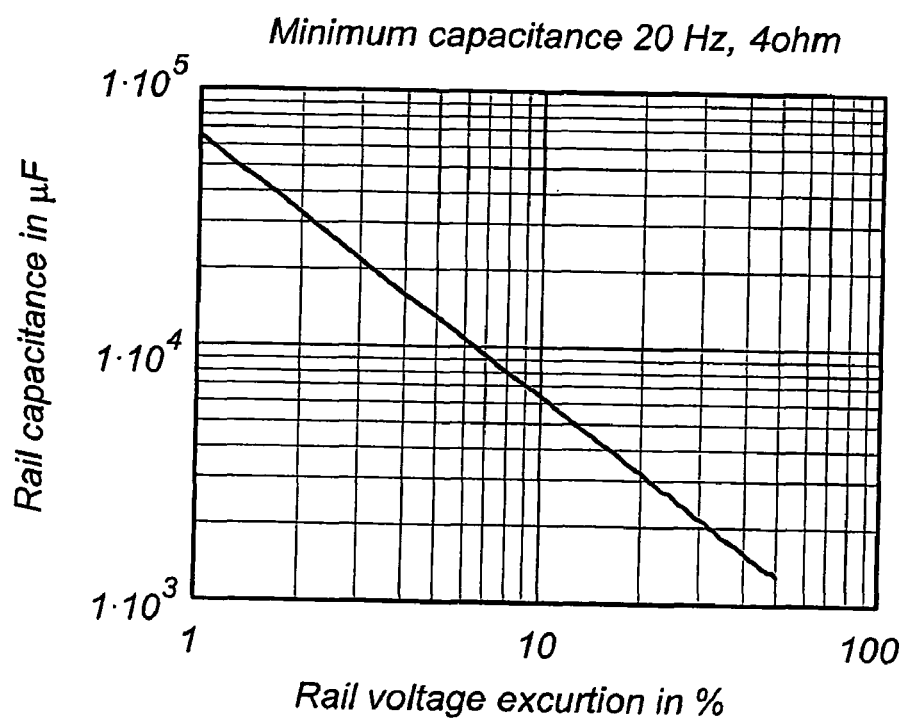
FIG. 5 is a graph of rail capacitance as a function of voltage rail excursion for a 4 ohm load 20 Hz worst case audio signal.

A block schematic of an audio power conversion system is shown in FIG. 1. The power supply (1) can be a switched mode supply or a linear type. Depending on the type of amplifier the supply is sourcing the output will be either a single rail or a dual rail supply. The class D amplifier (2) will typically be a half-bridge (single-ended) or a full-bridge topology. The number of channels in (2) can vary from 1 to multiple channels. The load (3) is typically an electro dynamic loudspeaker but can be any kind of transducer transforming the electrical signal from the amplifier to an acoustic signal. The power source (4) can be an AC-source, e.g. the utility net, or it could be a battery (e.g. automotive, portable equipment). The output of the power source (4) is a DC-voltage (or almost) which means that in case of an AC-source input, means to rectify and stabilize the voltage is included in (4). The electrical part of the audio power conversion system is defined as (3).

Given that the class D amplifier (2) is a single-ended type, the power supply (1) to support this topology will be a dual rail supply. The key object of the invention is to overcome the rail pumping problem discussed previously in an intelligent way such that the single-ended class D amplifier structure becomes more attractive. In a preferred embodiment of the invention the SRM (6) (Supply Rail Mirror) converter operates in parallel with the power supply (2).

Figure 8:
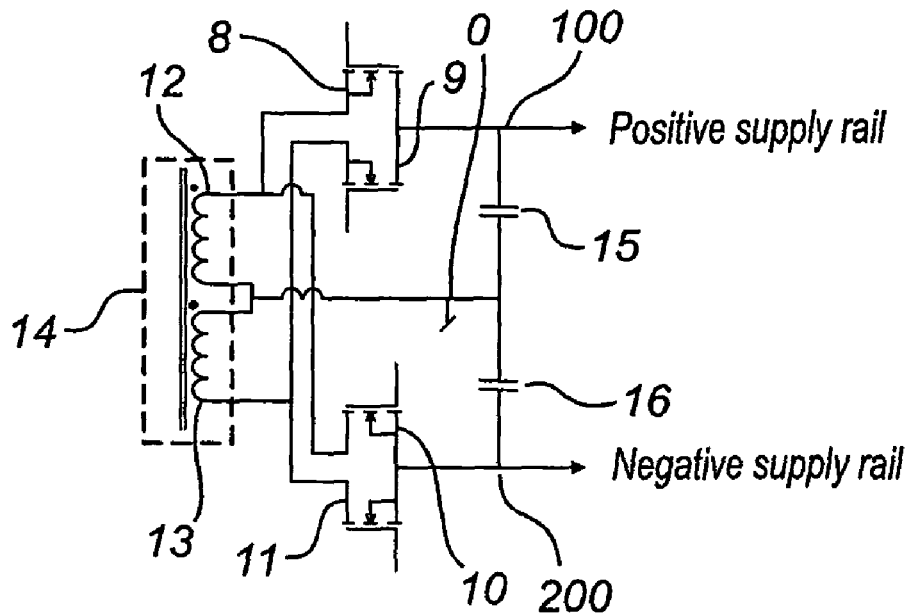
FIG. 8 shows a preferred embodiment of the invention.

A preferred implementation of the invention is shown in FIG. 8. The positive supply rail is connected to the junction between a first capacitor (15) and the drain-terminal of a first pair of MOSFETs (8) and (9). The source terminal of (8) is connected to a first terminal on a first transformer winding (12), and the source terminal of (9) is connected to a first terminal on a second transformer winding (13). The second terminal of the two transformer windings, (12) and (13), are connected to a common point (0). The two windings are coupled to each other through a transformer core of magnetic material (14). The negative supply rail is connected to the junction between a second capacitor (15) and the source-terminal of a second pair of MOSFETs (10) and (11). The drain terminal of (10) is connected to the junction between the transformer winding (12), and the source terminal of (8). The drain terminal of (11) is connected to the junction between the transformer winding (13), and the source terminal of (9). The two capacitors are connected to the two transformer windings in a common point (0).

Figure 15:
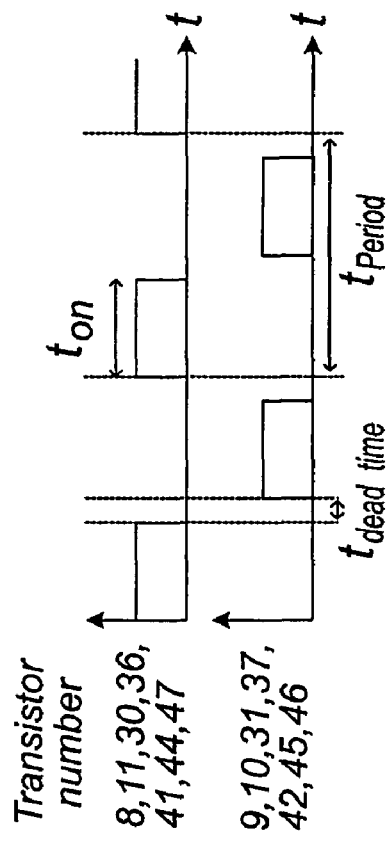
FIG. 15 shows the timing of the control signals for the switches in the preferred embodiments.

When operational and the transistors 8-11 is turned ON/OFF according to FIG. 15, the circuit will cancel the supply pumping by mirroring the two supply rails on to each other. In a first cycle, the transistors 8 and 11 will be turned ON. The positive supply rail across the capacitor 15 will then be put across the transformer winding 12. Likewise, the negative supply voltage on the capacitor 16 will be put across the transformer winding 13. Since the two windings are coupled to each other in a 1:1 ratio, any difference in the magnitude of the positive and negative rail voltage will cause a load current to migrate from the rail with the largest magnitude to the other rail. In the next cycle the same operation is performed but now with transistor 9 and 10 turned ON. This action secures the balancing of the transformer 14.

In a preferred embodiment of the invention the transistors 8-11 is turned ON and OFF under Zero Voltage Switching (ZVS) condition. By switching the transistors under this condition, losses associated with the ON and OFF transitions can be omitted. It is possible to achieve Zero Voltage Switching of the transistors by adjusting the magnetizing inductance of the transformer configuration (14) in such a way that the voltage across the transistors is fully reversed before the next transition occurs. To allow the ZVS to be completed it is necessary to have a small dead time between the transistor turn ON signals as shown in FIG. 15.

The magnetizing current needed to fully reverse the voltage across the transistors within the dead time window is given by:

$$I_{Magnetizing} \geq C_{Node} \cdot \frac{V_{DS}}{t_{Dead\_time}}, \quad (8)$$

where $C_{Node}$ is the accumulated capacitive load of the circuit node and $V_{DS}$ is the magnitude of the voltage in this particular node that has to be reversed within the dead time. Equation (8) is an approximation and is only valid as long as the dead time is much smaller than the switch on-time. One should also keep in mind that the $C_{Node}$ capacitance can be highly voltage dependent (e.g. output capacitance of MOSFETs and Anode-cathode capacitance of diodes)

The magnetizing current translates into a magnetizing inductance of:

$$L_{Magnetizing} \leq \frac{V_{DS} \cdot t_{ON}}{2 \cdot I_{Magnetizing}} \quad (9)$$

Substituting (8) into (9):

$$L_{Magnetizing} \leq \frac{t_{Dead\_time} \cdot t_{ON}}{2 \cdot C_{Node}} \quad (10)$$

The magnetizing inductance of the non-ideal transformer (14) can then be used to facilitate the ZVS transition. Since practical transformer also exhibits non-ideal coupling between windings, this uncoupled transformer flux can be regarded as a parasitic inductance in series with the transformer windings. This inductance is normally referred to as leakage inductance.

According to the invention it is also possible to shape the current in the SRM so that Zero Current Switching (ZCS) is possible (disregarding transformer magnetizing current). The ZCS is possible by creating a resonant tank using the transformer leakage inductance and the capacitors 15 and 16. The current resonance must go through a full-wave oscillation which means that the ideal current shape will be that of a squared sinusoidal. The resonant tank must obey:

$$t_{ON} \cong 2 \cdot \pi \cdot \sqrt{L_{Leakage} \cdot (C_{15}+C_{16})} \quad (11)$$

Figure 9:
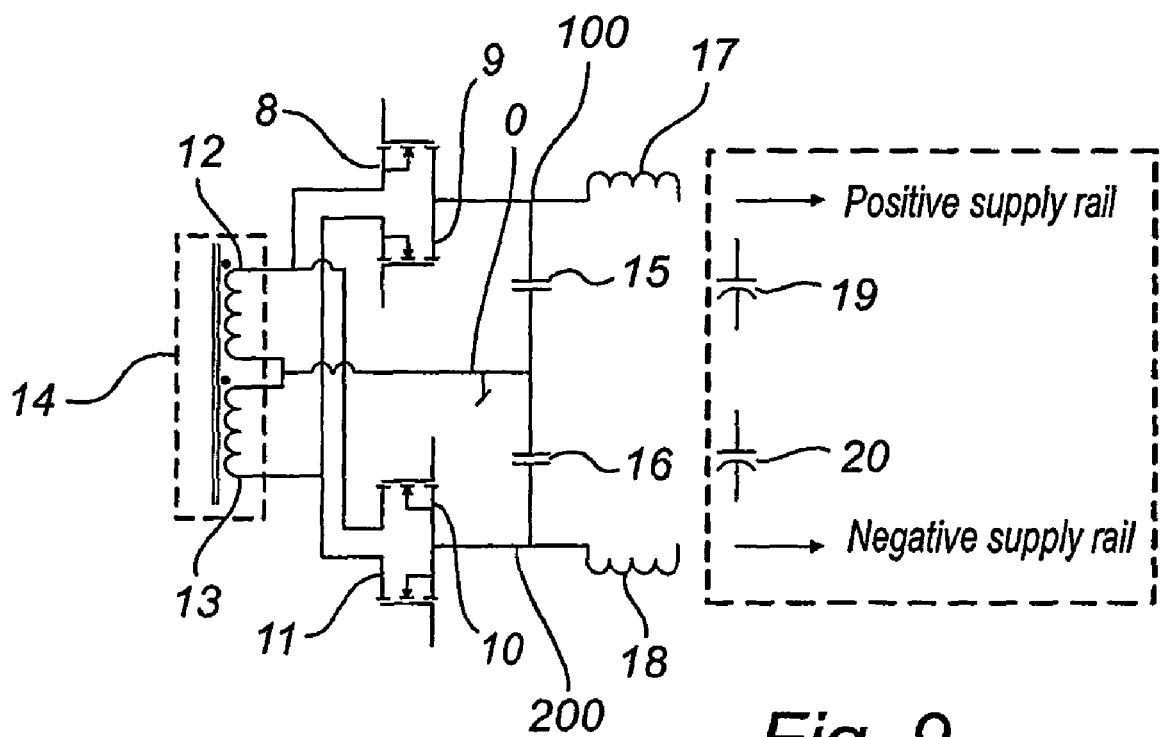
FIG. 9 same as FIG. 8 but with a rail separation filter added.

In some applications it is not possible to control the values of the capacitors 15 and 16 to accommodate the resonant current transition. In such a case one can according to the invention apply a filter that separates the capacitors 15 and 16 from the power supply rails in terms of high frequency influence (FIG. 9). The separation is done by adding the inductor 17 between the capacitor 15 and the positive supply rail and adding the inductor 18 between the capacitor 16 and the negative supply rail. In this way the HF behaviour of the circuit and thereby the resonance frequency between the capacitors 15 and 16 and the leakage inductance can be controlled.

Figure 10:
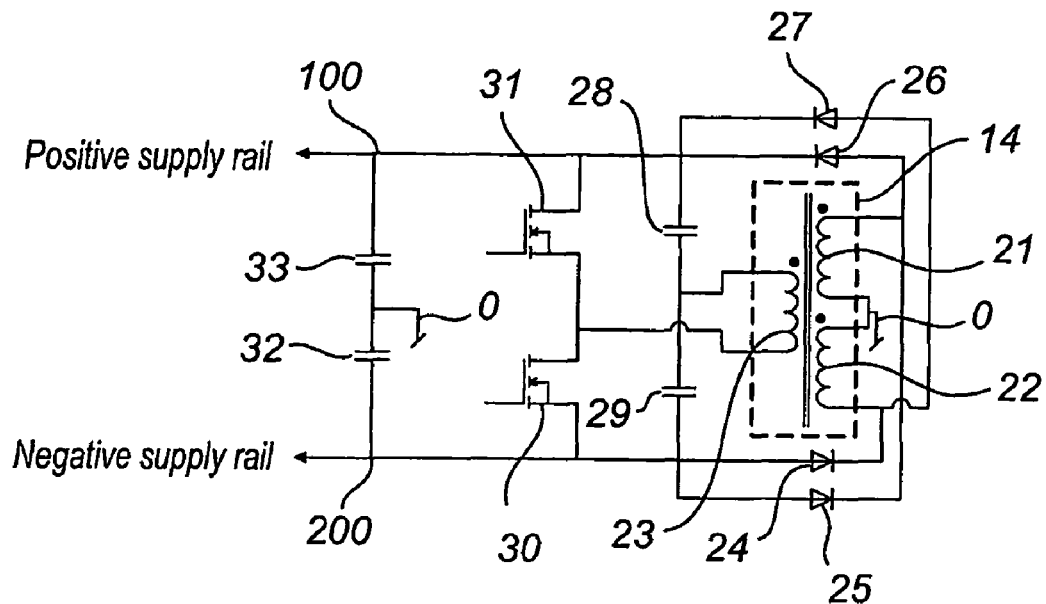
FIG. 10 shows another preferred embodiment of the invention.

Another preferred embodiment of the invention is shown in FIG. 10. The transistors 30 and 31 form a half-bridge configuration with the capacitors 28 and 29. The transformer winding 23 is connected between the junction of transistor 30, 31 and capacitors 28, 29. The first terminal of transformer winding 21 is connected to the anode of diode 26 and the cathode of diode 25. The second terminal of transformer winding 22 is connected to the anode of diode 27 and the cathode of diode 24. The second terminal of transformer windings 21 and the first terminal of transformer winding 22 are connected together and to the common point 0. The cathodes of diodes 26 and 27 are connected to the junction of capacitor 28, transistor 31 and capacitor 33 which again is connected to the positive supply rail. The anodes of diodes 24 and 25 are connected to the junction of capacitor 29, transistor 30 and capacitor 32 which again is connected to the negative supply rail. The junction of capacitor 33 and 32 is connected to the common point 0.

The transistors are operated according to FIG. 15 with non-overlapping near 50% duty-cycle. In case of supply pumping either the voltage across capacitor 33 or 32 will increase. This voltage increase will also be found on capacitors 28 and 29 but because of the circuit configuration the voltage increase will be split between the two of them. Turning ON the transistor 30 will put the capacitor 29 voltage across the transformer winding 23. If the capacitor 33 is being pumped, current from capacitor 29 will be transformed through winding 23 to winding 22 and charge capacitor 32 through the diode 24. In the next cycle, transistor 31 will put the capacitor 28 voltage across the transformer winding 23. Assuming that the capacitor 33 is being pumped, current from capacitor 28 will be transformed through winding 23 to winding 21 and charge capacitor 32 through the diode 25. Pumping of the capacitor 32 will result in similar operation as described above but with the diodes 26 and 27 being active instead of diodes 24 and 25.

As for the previous implementation of the invention, this circuit also facilitates ZVS of the transistors in a similar manner.

ZCS operation of the circuit shown in FIG. 10 is also possible. The resonant tank in this circuit is formed by the capacitors 28 and 29 together with the leakage inductance of transformer 14. The resonant current is a half-wave sinusoidal and will result in a Zero Current Switching (ZCS) transition if.

$$t_{ON} \cong \pi \cdot \sqrt{L_{Leakage} \cdot (C_{28}+C_{29})} \quad (12)$$

Figure 11:
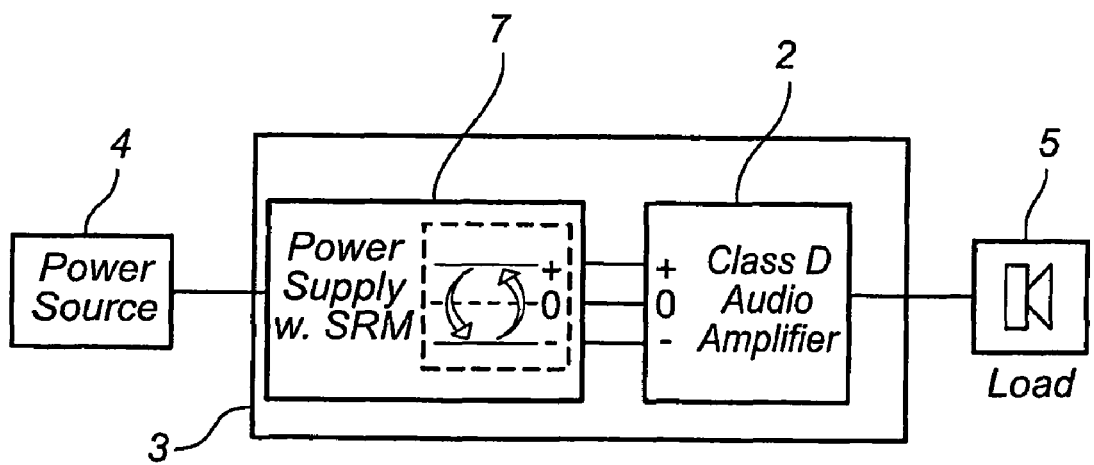
FIG. 11 shows a block diagram of the pump canceling converter integrated in the main power supply.

Another preferred embodiment of the invention is shown in FIG. 11. In this implementation, the SRM and the power supply is integrated into one stage. All of the implementations of the invention presented until now can be changed into a power supply with integrated SRM. The transformation is quite simple and is done by adding a winding (or windings) to the transformer configuration (14).

Figure 14:
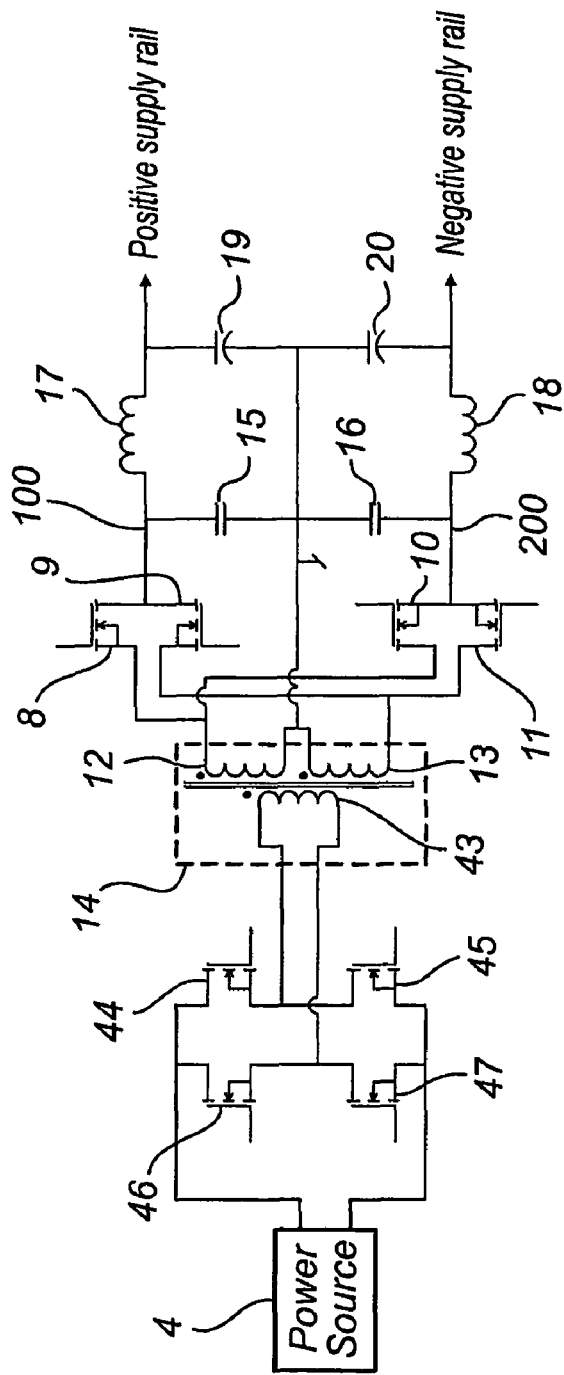

A preferred embodiment of the invention where the power supply and the SRM has been integrated can be seen in FIG. 12. The additional circuitry compared to the stand alone SRM shown in FIG. 9 can easily be identified as two additional transformer windings 34 and 35 and a push-pull configuration implemented by the transistors 36 and 36. The invention is not limited to use push-pull primary circuits but can be implemented as any primary-side referenced circuits like the half-bridge configuration shown in FIG. 13 and the full-bridge configuration shown in FIG. 14.

Figure 6:
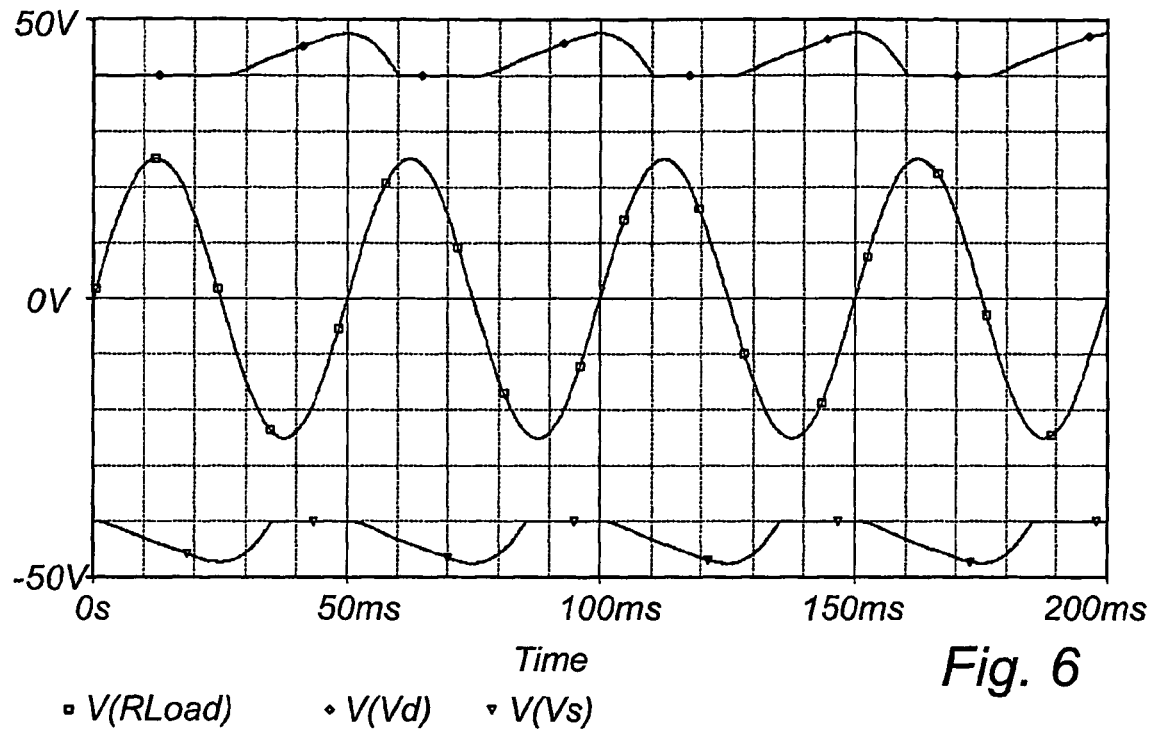
FIG. 6 is a simulation of the rail pumping in case of a 20 Hz worst case audio signal in a 4 ohm load with 3300 uF on each rail.
Figure 7:
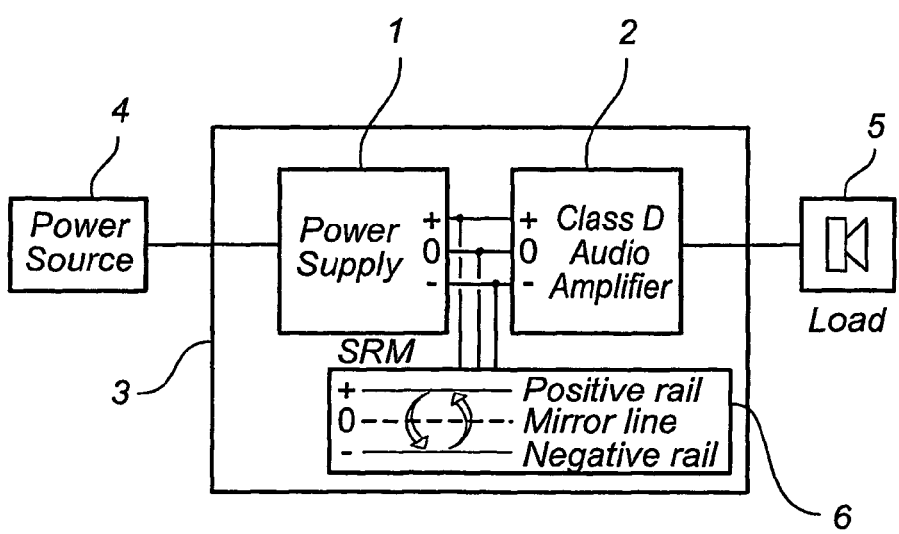
FIG. 7 shows an audio power conversion system with a supply pump canceling circuit attached to the supply rails (SRM).
Figure 16:
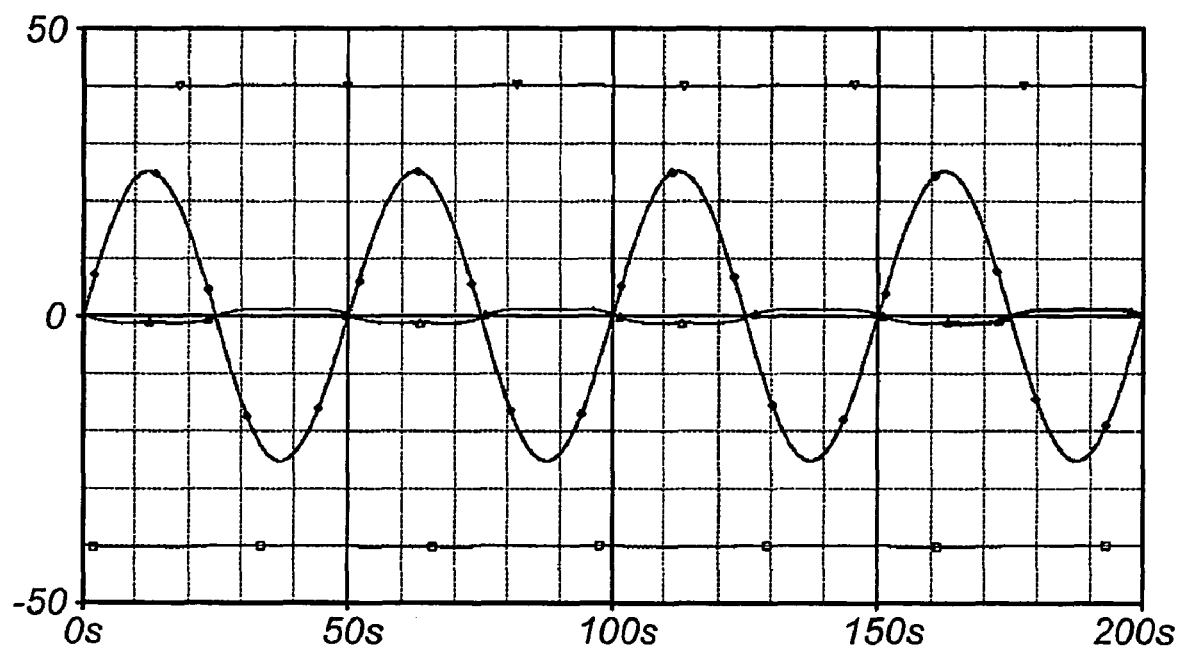
FIG. 16 shows the effect of adding a pump canceling circuit to a system with a 2×125 W in 4 ohm with no (or little) output capacitors.

As discussed previously FIG. 6 shows the rail voltage variation for a stereo setup with 2×125 W in 4 ohm. The rail capacitance in this example was 2×3300 uF on each rail (4×3300 uF total). By adding the pump cancelling circuit shown in FIG. 9 and removing the rail capacitors (2×22 uF remaining) the voltage variations have practical disappeared as shown in FIG. 16. The slight variation that can be seen is caused by resistive voltage drops in the non-ideal switches, inductors and transformer windings.

The invention claimed is:

1. An audio power conversion system, comprising:

a power supply having a positive supply rail and a negative supply rail for supplying power to a single ended class D amplifier; and a supply pump reduction circuit, connected to the supply rails and adapted to redistribute a pumping charge from said power supply by forcing a current-flow from a rail with a relatively higher voltage to a rail with a relatively lower voltage, wherein said supply pump reduction circuit comprises a high frequency transformer having a first and a second winding alternatingly connectable during a first and second cycle to said positive and negative supply rails, so as to cause a current to migrate from the rail with the highest voltage to the rail with the lowest voltage, while balancing said transformer, and wherein said supply pump reduction circuit further comprises:

a first capacitor connected between a first common point and a second common point, a first switch connected between said second common point and a first terminal of the first transformer winding, a second switch connected between said second common point and a second terminal of the second transformer winding, a second capacitor connected between said first common point and a third common point, a third switch connected between said third common point and said first terminal on said first transformer winding, a fourth switch connected between said third common point and said second terminal on said second transformer winding and wherein a second terminal of said first transformer winding and a first terminal of said second transformer winding are connected to said first common point, so that a resonant tank is formed by a leakage inductance of said transformer and said capacitors, said resonant tank obeying the relationship:

$$t_{ON} \cong 2 \cdot \pi \cdot \sqrt{L_{Leakage} \cdot (C_{15} + C_{16})},$$

where $t_{ON}$ is the time during which said switches are switched ON, $C_{15}$ is the capacitance of said first capacitor, and $C_{16}$ is the capacitance of said second capacitor thereby enabling zero current switching of said switches.

2. The system according to claim 1, further comprising a switch control system for providing two pulse trains with equally spaced, non-overlapping pulses of equal length, for controlling said controlled switches.

3. The system according to claim 2, wherein the control pulses are PWM modulated.

4. The system according to claim 1, wherein said supply pump reduction circuit further comprises:
a first separation filter inductor connected between a first common point and the positive supply rail, and
a second separation filter inductor connected between a second common point and the negative supply rail.

5. The system according to claim 1, wherein said supply pump reduction circuit is integrated in the power supply.

6. The system according to claim 1, wherein said transformer has a third and a fourth transformer winding, and wherein said supply pump reduction circuit further comprises:
a fifth switch having a first terminal connected to said third transformer winding and a second terminal connected to a power source, and
a sixth switch having a first terminal connected to said fourth transformer winding and a second terminal connected to said power source.

7. The system according to claim 1, wherein said transformer has a third transformer winding, and wherein said supply pump reduction circuit further comprises:
a third capacitor connected between a first terminal of said third winding and a power supply,
a fifth switch connected between a second terminal of said third winding and said power supply,
a fourth capacitor connected between said first terminal of said third winding and said power supply, and
a sixth switch connected between said second terminal of said third winding and said power supply.

8. The system according to claim 1, wherein said transformer has a third transformer winding, and wherein said supply pump reduction circuit further comprises:
a fifth switch connected between a first terminal of said third winding and a power supply,
a sixth switch connected between a second terminal of said third winding and said power supply,
a seventh switch connected between said first terminal of said third winding and said power supply, and
an eighth switch connected between said second terminal of said third winding and said power supply.

9. The system according to claim 1, wherein said transformer windings are magnetically coupled to each other in a transformer core of a magnetic material.

10. The audio power conversion system according to claim 1, wherein said transformer has a leakage inductance to enable zero current switching (ZCS).

11. The audio power conversion system according to claim 10, wherein the magnetizing inductance is selected as:

$$L_{Magnetizing} \leq \frac{t_{Dead\_time} \cdot t_{ON}}{2 \cdot C_{Node}}$$

where $t_{ON}$ is the time during which said switches are switched ON, $t_{dead\_time}$ is the time between periods when said switches are switched ON, and $C_{node}$ is an accumulated capacitive load of a relevant circuit node.

12. The audio power conversion system according to claim 1, wherein said transformer has a magnetizing inductance to enable zero voltage switching (ZCS).

13. An audio power conversion system comprising:
a power supply having a positive supply rail, a negative supply rail for supplying power to a single ended class D amplifier, and
a supply pump reduction circuit connected to the supply rails and adapted to redistribute a pumping charge from said power supply by forcing a current-flow from a rail with a relatively higher voltage to a rail with a relatively lower voltage,
wherein said supply pump reduction circuit comprises a high frequency transformer having a first and a second winding alternatingly connectable during a first and second cycle to said positive and negative supply rails, so as to cause a current to migrate from the rail with the highest voltage to the rail with the lowest voltage, while balancing said transformer,
wherein said supply pump reduction circuit comprises:
a first capacitor connected between a first common point (0) and a second common point,
a first diode having a cathode connected to said second common point and an anode connected to a first terminal of said first transformer winding,
a second diode having a cathode connected to said second common point and an anode connected to a second terminal of a second transformer winding,
a second capacitor connected between said first common point and a third common point,
a third diode having an anode connected to said third common point and a cathode connected to said second terminal of said second transformer winding,
a fourth diode having an anode connected to said third common point and a cathode connected to said first terminal of said first transformer winding,
wherein a second terminal of said first transformer winding and a first terminal of said second transformer winding are connected to said first common point,
a third capacitor connected between said second common point and a first terminal of said third transformer winding,
a fourth capacitor connected between said first terminal of said third transformer winding and said third common point,
a first switch connected between said second common point and a second terminal of said third transformer winding, and
a second switch connected between said second terminal of said third transformer winding and said third common point, so that a resonant tank is formed by a leakage inductance of said transformer and said third and fourth capacitors, said resonant tank obeying the relationship:

$$t_{ON} \cong 2 \cdot \pi \cdot \sqrt{L_{Leakage} \cdot (C_{28} + C_{29})},$$

where $t_{ON}$ is the time during which said switches are switched ON, $C_{28}$ is the capacitance of said third capacitor, and $C_{29}$ is the capacitance of said fourth capacitor thereby enabling zero current switching of said switches.

14. The system according to claim 13, further comprising a switch control system for providing two pulse trains with equally spaced, non-overlapping pulses of equal length, for controlling said controlled switches.

15. The system according to claim 14, wherein the control pulses are PWM modulated.

16. The system according to claim 13, wherein said transformer windings are magnetically coupled to each other in a transformer core of a magnetic material.

17. The audio power conversion system according to claim 13, wherein said transformer has a leakage inductance to enable zero current switching (ZCS).

18. The audio power conversion system according to claim 17, wherein the magnetizing inductance is selected as:

$$L_{Magnetizing} \leq \frac{t_{Dead\_time} \cdot t_{ON}}{2 \cdot C_{Node}}$$

where $t_{ON}$ is the time during which said switches are switched ON, $t_{dead\_time}$ is the time between periods when said switches are switched ON, and $C_{node}$ is an accumulated capacitive load of a relevant circuit node.

19. The audio power conversion system according to claim 13, wherein said transformer has a magnetizing inductance to enable zero voltage switching (ZCS).

\* \* \* \* \*